United States Patent [19]

Owen

[11] Patent Number: 5,471,402
[45] Date of Patent: Nov. 28, 1995

[54] FREQUENCY COUNTER

[75] Inventor: William P. Owen, Ft. Lauderdale, Fla.

[73] Assignee: Optoelectronics, Inc., Fort Lauderdale, Fla.

[21] Appl. No.: 310,228

[22] Filed: Sep. 21, 1994

Related U.S. Application Data

[63] Continuation of Ser. No. 695,568, May 31, 1991, abandoned.

[51] Int. Cl.$^6$ ............................ G01R 23/00; G06F 17/00
[52] U.S. Cl. ................... 364/484; 324/76.48; 324/76.62; 324/76.74
[58] Field of Search .................................. 364/484, 485, 364/486, 487; 324/76.42, 76.47, 76.48, 76.58, 76.62, 76.74

[56] References Cited

U.S. PATENT DOCUMENTS

| | | | |
|---|---|---|---|
| 4,027,146 | 5/1977 | Gilmore | 364/484 |
| 4,258,423 | 3/1981 | Lane et al. | 364/484 |
| 4,310,891 | 1/1982 | Niki | 364/484 |
| 4,319,329 | 3/1982 | Girgis et al. | 364/484 |
| 4,350,950 | 9/1982 | Waldmann et al. | 324/76.61 |
| 4,395,762 | 7/1983 | Wondergem | 364/484 |
| 4,996,474 | 2/1991 | Tambe et al. | 324/76.48 |
| 5,043,909 | 8/1991 | Meyers et al. | 364/484 |

*Primary Examiner*—Vincent N. Trans
*Attorney, Agent, or Firm*—Malin, Haley, DiMaggio & Crosby

[57] ABSTRACT

An improved frequency counter for detecting and distinguishing a main input signal from amplifier generated self-oscillating signals, wherein the frequency counter generally includes an input circuit having an amplifier and Schmitt-Trigger, a microprocessor for controlling the main gate to a main counter and user inputs, and a signal level display, all of which communicate with the main counter, a display driver and a frequency display for more accurate frequency measurements.

29 Claims, 3 Drawing Sheets

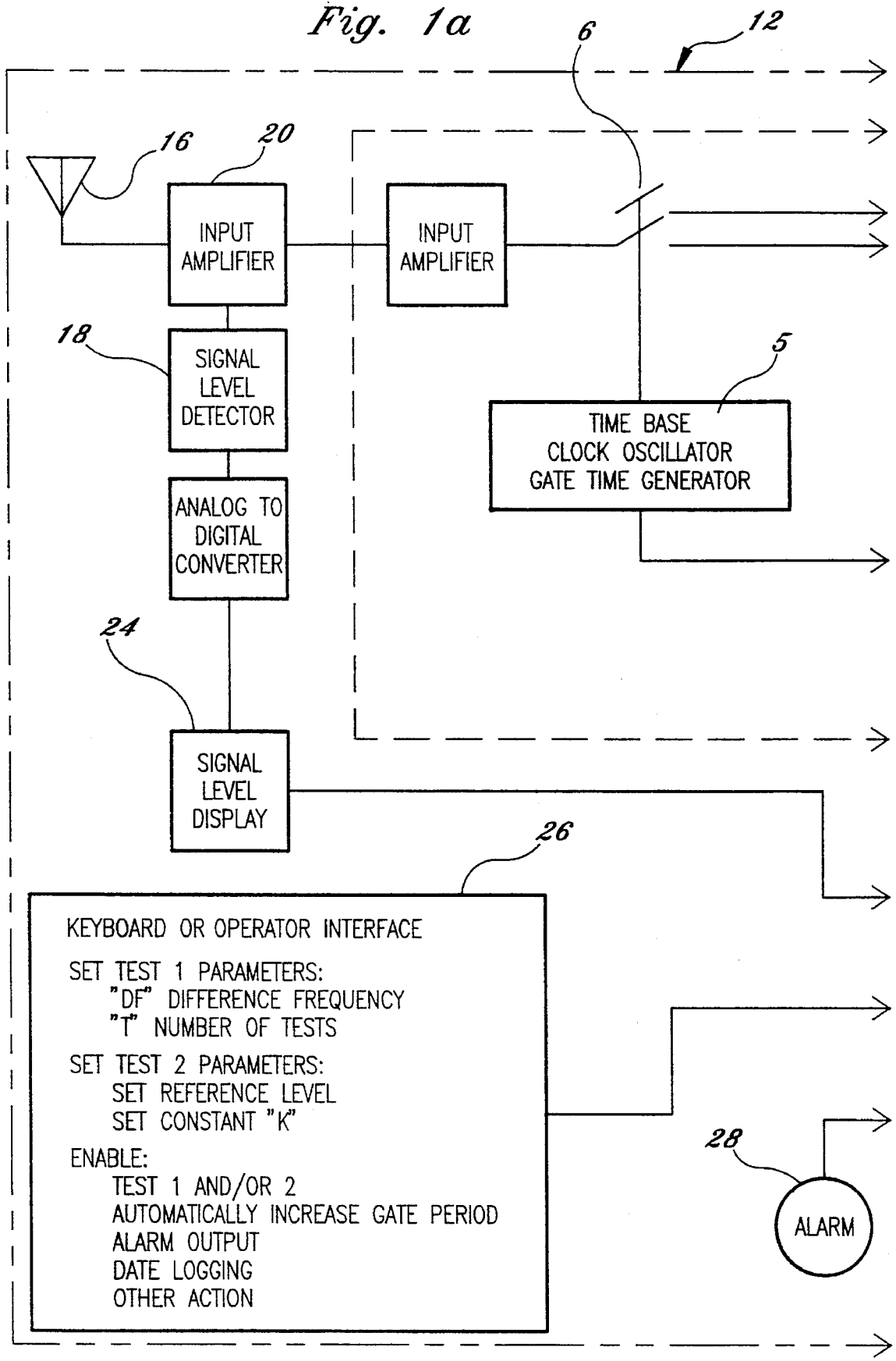

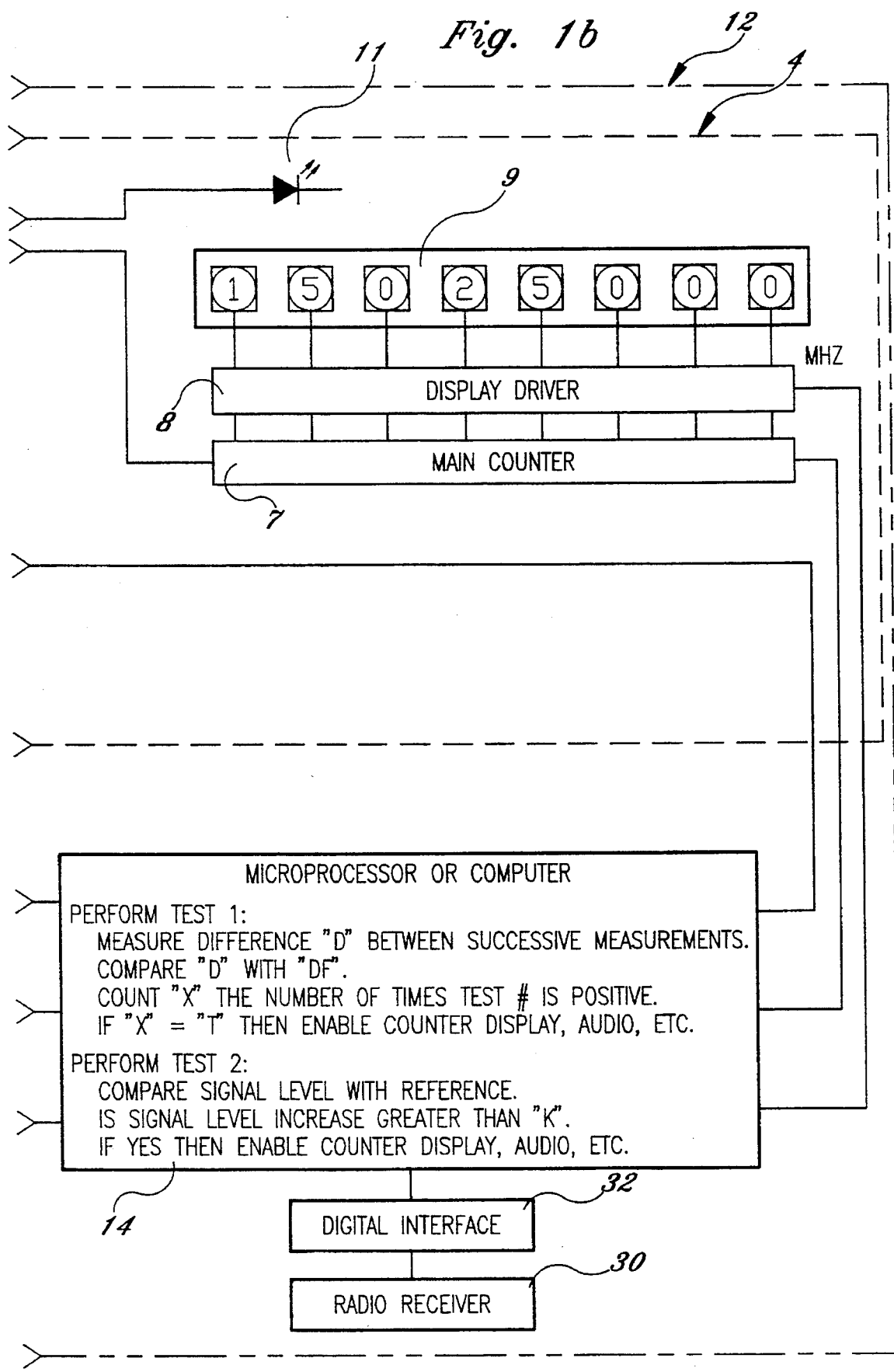

FREQUENCY COUNTER

This application is a continuation of U.S. application Ser. No. 07/695,568 filed May 3, 1991 now abandoned.

BACKGROUND OF THE INVENTION

1. Field of the Invention

This invention relates to frequency counters and more particularly to frequency counters having increased amplifier input gain and the ability to detect and distinguish a dominant signal of interest from a signal resulting from amplifier self-oscillation.

2. Description of the Prior Art

A frequency counter is a test instrument which measures the frequency of an electrical signal. The frequency is typically determined by counting the number of times the oscillating signal crosses some voltage, usually a zero volt reference, during some precise time interval.

A typical prior art counter is shown in FIG. 1 within the dotted lines with reference number 4. An electrical signal is presented to the input through input circuitry 10 containing an amplifier which amplifies the input signal to a level which can be acted upon by the electronic components of the prior art counter.

An additional function of the input circuitry 10 is that it must accept any electrical input signal such as a sine wave, square wave, pulses or a complex signal which may be a combination of such signals including signals of varying polarity, amplitude or frequency and produce at the output one electrical pulse per input cycle. For this output pulse to be used by the subsequent electronic circuitry, the output pulse must be of a constant amplitude and width for any input signal. This conversion from varying input signals to a string of output pulses is usually done by a Schmitt-trigger circuit, such as is common in the art.

The output pulse from the input circuitry 10 is passed to a main gate 6. Conceptually, the main gate is nothing more than an on-off switch. When the switch is closed the pulses pass to a main counter 7. When main gate 6 is open, no signal is passed to the main counter 7.

Main gate 6 is controlled by a time base 5 which tells the gate when to open and when to close. Time base 5 is usually a clock which generates accurately spaced electrical pulses which open and close main gate 6. Typically, time base 5 produces gate open times in decade steps from as short as 1 microsecond to more than 10 seconds.

A gate light 11 indicates, usually through a light on the front panel of the counter 4, that the main gate 6 is closed and thereby allowing the pulses generated by the Schmitt-trigger circuitry to pass to the main counter 7.

The main counter 7 counts the number of pulses passed through main gate 6. In a typical prior art frequency counter 4, the time base 5 closes the main gate 6 for a period of one second. Therefore, if a pulse is generated for each cycle of the input signal by the Schmitt-trigger circuitry, the number of pulses counted by the main counter 7 in one second is equal to the frequency of the input signal since frequency is defined as the number of cycles per second.

In the typical prior art frequency counter, a display driver 8 is connected to the main counter 7 to convert the electrical high level signals, on the main counter circuitry representing the number of pulses counted, into low level electrical signals for driving a frequency display 9. Display 9 may include columnar gas read outs such as neon lamps or incandescent lamps, in-line-to read outs such as light emitting diodes, liquid crystal display, or a meter-movement type of read out. In the typical prior art frequency counter where the time base 5 closes the main gate 6 for a period of one second, the display, which is the frequency of the input signal, is just on the number of pulses counted by the main counter 7 while the main gate 6 is closed.

Once a frequency has been determined, an electronic latch allows display driver 8 to display the frequency on display 9 for a predetermined amount of time. During the time the frequency is being displayed, a new frequency measurement may be taking place so that when the time allowed by the latch to display the last measured frequency has expired, the newly measured frequency may be allowed by the latch to be displayed.

With the advent of the microprocessor, frequency counters containing microprocessors have become more common. In such frequency counters, the time base 5, instead of being constrained to close the main gate 6 for a period of one second or decade multiples thereof, opens main gate 6 for periods of varying durations as directed by the microprocessor. While the main gate 6 is closed, main counter 7 counts the number of pulses passing through the main gate 6. Thereafter, the frequency is arithmetically calculated in the microprocessor by dividing the number of pulses counted by main counter 7 by the length of time main gate 6 is closed.

The use of a microprocessor allows for a longer or shorter time to count the pulses generated by the input signals than is available in the typical prior art counter with the decade periods of measurement. When the period that main gate 6 is closed is increased, the accuracy of the frequency counter 4 is increased. However, because main gate 6 is closed for a longer time before a frequency is determined and consequently displayed on display 9, it is often useful to initially reduce the period that main gate 6 is closed in order to get a virtually instantaneous, although less accurate frequency display. Then, if desired, a more accurate subsequent determination of the frequency can be obtained by closing main gate 6 for a longer time.

Often, the input signal strengths of high frequency signals, such as ambient radio or high frequency signals, are quite small, typically 10–15 millivolts. Moreover, the ambient signals picked up from an antenna are not only low in level, but often pick up more than one signal at a time. In any event, these input signal strengths must be amplified to an appropriate level to allow these low level signals to trigger the digital circuitry of the counter and allow the subsequent electronic components to determine the frequency of the signal. This amplification is performed by input amplifiers which amplify the input signal to an appropriate signal strength level. These amplifiers are typically limited in the amount of amplification they can perform because once the amplifier gain is increased beyond about 25 dB, the amplifiers become unstable and start self-oscillating. Amplification above 50 dB produces very strong self-oscillation while the amplification of the signal of interest drops off. When this much amplification is used, the self-produced electrical noise present in all electronic circuitry becomes more apparent. The noise of the first stage of the amplifier is amplified by subsequent stages until it is itself a countable signal. The electrical noise appears as a self-oscillation, producing a diffused, broad bandwidth signal that cannot be easily measured. These additional signals compete with the main signals of interest picked up from the antenna and may even be present in the case of no antenna input. As a result, the frequency counter displays random readings over a range of frequencies when trying to determine the frequency of the main signal. Because the frequency counter must have pure signals to accurately count the frequency, more than one signal only confuses the counting and yields incorrect measurements.

This self-oscillation is manifest in the creation of a relatively strong signal at a frequency which varies considerably with time within a predictable frequency range. Studies of amplifier self-oscillation have indicated that the range of frequencies through which an amplifier may self-oscillate is predictable, but the exact frequency of self-oscillation that is produced at a given time is unpredictable. However, studies have also found that the exact frequency of the signal produced by amplifier self-oscillation will vary with time. As a result, consecutive measures of the amplifier self-oscillation signal frequency will produce different frequencies. This self-oscillation signal is produced while the amplifier continues to amplify the signal of interest.

By contrast, the frequency of the signal of interest will remain approximately constant through repeated measurements.

The self-oscillation signal produces serious difficulties for the frequency counter. The frequency counter has difficulty in determining whether the frequency counted is the signal of interest or is the amplifier self-oscillation signal. In fact, even in the absence of a signal of interest, the counter may measure and display the frequency of the amplifier self-oscillation signal. As a result, in order to avoid creating an amplifier self-oscillation signal, amplifiers have been limited in amplification to about 25 dB. Consequently, amplifier input gain is limited to this amount. This is a problem in want of a solution.

An additional problem with the prior art frequency counters occurs when a pick-up antenna is used on the input to the amplifier. In this case, many radio frequency signals may be present at the same time along with an amplifier self-oscillation signal. These signals will combine as described in a Fourier Series to produce a resultant signal which does not resemble any of the input signals. When the counter counts the number of zero crossings per unit time from such a combined signal, the resulting calculated frequency will not accurately reflect the frequency of any of the input signals.

The exception to this is where one of the input signals is so strong that it dominates the other input signals. Such a dominant signal will typically be 10–15 dB larger than any other signal. However, such dominant signal strengths are typically found in only the near field of a transmitting transmitter. Finding such dominant signal strengths indicates that the receiver is very near to the transmitter.

In the prior art, in order to detect the presence of a nearby RF transmission, a spectrum analyzer is used. Such spectrum analyzers typically scan a RF spectrum and indicate graphically by a "spike" the signal strength of each signal found at its corresponding frequency. The height of the "spike" indicates the signal strength. Thereafter, a trained technician analyzes the resulting chart of frequency and signal strength to determine which signals are inappropriately large or unexplained, thereby indicating the presence of a transmitting device. The disadvantage of such spectrum analyzers is that they are relatively expensive, typically costing from $20,000–$30,000. Another problem with spectrum analyzers is that they are typically quite large in size. As such, they are cumbersome, bulky and difficult to transport.

Spectrum analyzers have been used in the past for security purposes to scan a large RF spectrum to ensure that no near RF transmissions anywhere in the scanned RF spectrum are present. The spectrum analyzer will produce "spikes" at all the frequencies where signals are detected, but will not distinguish between a near field transmission as opposed to a transmission of from farther away. Such a nearby transmission would merely appear as one of the "spikes" on the spectrum analyzers output which would then require a trained operator to recognize.

SUMMARY OF THE INVENTION

The present invention solves the above-noted problems by incorporating a microprocessor or similar circuitry to compare successive readings from the frequency counter. If two or more successive readings are identical or within some small predetermined variation of each other, the microprocessor accepts these as valid readings since it is highly likely that these readings are not random readings, but rather the result of counting a stable frequency source. If a set of readings meets the variation criteria, the signal is passed on to the frequency display as a valid signal measured. Accordingly, circuitry has been added to an ordinary frequency counter to determine if a signal of interest, as opposed to a signal generated by amplifier self-oscillation, is present and to interrupt the normal function of the counter if an amplifier self-oscillation signal is being measured. The circuitry makes successive frequency measurements and then determines the difference in the measurements. If the frequency difference "DF" is larger than a preselected value, the frequency being counted is most likely the frequency of the amplifier self-oscillation signal and not the frequency of the signal of interest.

Experiments have shown that when the frequency of the amplifier self-oscillation signal is successively measured, the frequencies will not be within 10 kHz of each other. Consequently, the preselected value of 10 kHz has been found to be a good difference frequency "DF" to distinguish an amplifier self-oscillation signal from a dominant signal of interest.

Because the signal of interest typically has a constant frequency over time while a signal created by amplifier self-oscillation does not, it is sometimes useful to require that a series of frequency measurements be made, each not different from the last by more than the difference frequency "DF". A series of these "successful" measurements creates a reasonable certainty that the frequency measurements are of the signal of interest and not from amplifier self-oscillation. Thereafter, the frequency measured may be displayed.

The number of "successful" measurements required before the frequency may be displayed is called "T" for "tests". In practice, "T"=2 has been found to produce favorable results. "T"=2 is also the minimum number of "successful" measurements needed to distinguish the signal of interest from an amplifier self-oscillation signal.

Additional circuitry measures the average signal strength of the background input frequency spectrum and stores this value in electronic memory. Then, the background input frequency strength is monitored. If the average background input frequency strength rises a certain predetermined amount "K" above the original stored average background signal strength level, a dominant signal from a nearby transmission is indicated. The frequency of the dominant signal is determined by the frequency counter circuitry. The presence of the dominant signal preferably triggers a visual and audible alarm and the frequency of the dominant signal is displayed.

The circuitry implementing the measurement of the background signal strength and any changes therein, is accomplished by combining all the signal in the RF input spectrum into a combination signal. The combination signal is an alternating electrical signal which is converting into a direct current signal whose voltage is indicative of the signal strength. The voltage is initially stored as a reference voltage representing the average background input signal strength.

The current background input signal strength is then continuously compared to the reference input signal strength. When the current signal strength increases beyond a preselected value above the reference signal strength, the presence of a nearby transmission within the input RF spectrum is indicated. When this occurs, control signals are created which may trigger an alarm or allow the frequency of the nearby transmission to be displayed.

A dominant signal of interest will be detected by either of the groups of circuitry described above.

It is therefore an object of the invention to discriminate a signal of interest from an amplifier self-oscillation signal.

It is another object of the invention to detect the presence of a dominant signal indicating a nearby RF transmission.

It is a further object of the invention to combine the flexibility of microprocessor directed frequency counter with the teaching of the instant invention.

It is another object of the invention to create a relatively inexpensive improved frequency counter.

It is still further an object of the invention to create a small improved frequency counter according to the teachings of this disclosure which may be used for personal security to detect the presence of a nearby RF transmission.

These and other objects of the invention will be clear from the description contained herein and more particularly with reference to the accompanying drawings and following detailed description of the invention.

BRIEF DESCRIPTION OF THE DRAWINGS

FIG. 1A and 1B are block diagram of the invention.

DESCRIPTION OF THE PREFERRED EMBODIMENTS

Figure 2:
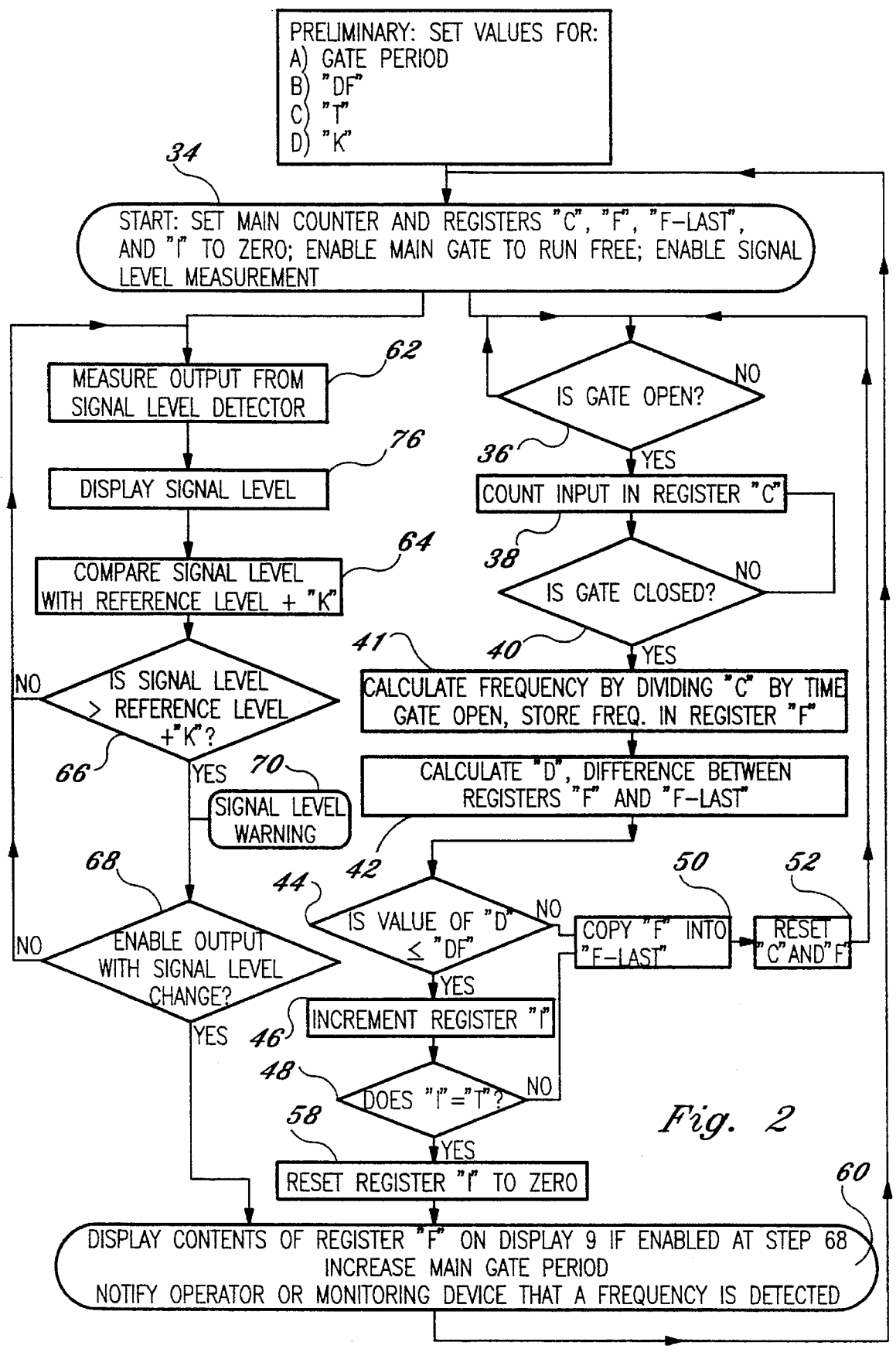
FIG. 2 is a flow chart of the method of the invention.

In the improved frequency counter 12, as shown in FIG. 1, a signal passes from an input source such as an antenna 16 through input circuitry 20. Input circuitry 20 includes an amplifier which has the ability to amplify the input signal beyond the 25 dB maximum usually found in prior art frequency counters. When the amplifier amplifies the input signal above 25 dB but less than 40–50 dB, self-oscillation may be produced in addition to the amplification of the signal of interest.

In the improved frequency counter 12, as in the prior art counters as discussed above, an important component of the input circuitry 20 is to change the input signal, which may be of any type or combination of types, into an output signal comprising a series of pulses having constant amplitude and a constant duration. This is performed in the input circuitry 20 by the use of Schmitt-trigger circuitry as is common in the art. The resulting pulses are presented to the main gate 6. In the improved frequency counter 12, the input circuitry 10 normally found in the prior art frequency counter 4 is replaced with the input circuitry 20 as described.

A microprocessor 14 triggers asynchronous main gate 6 for varying amounts of time. Time base 5 is the clock which times how long main gate 6 is opened and closed as directed by microprocessor 14. The pulses from input circuitry 20 pass through main gate 6, when closed, to main counter 7 where they are counted and stored in RAM memory in microprocessor 14. The frequency of the signal is calculated by dividing the number of pulses counted by main counter 7 by the time main gate 6 is open.

Microprocessor 14 may then direct the frequency to display 9 through the enablement of display driver 8. Microprocessor 14 is preferably controlled by user direction through keyboard 26.

Microprocessor 14 will have at least four registers: Register "C" which will contain the number of pulses counted by the main counter 7; Register "F" will contain the current calculated frequency of the input signal; Register "F-LAST" will contain the last calculated frequency or zero if the current frequency is the first frequency calculated; and, Register "I" contains the number of non-self-oscillating frequency measurements made.

The determination of whether amplifier self-oscillation or a dominant signal is producing the pulses counted by the main counter 7 is made by the invention according to the direction of microprocessor 14 programmed to follow the steps in the flow chart shown in FIG. 2.

Preliminarily, the length of time that main gate 6 will be closed, the main gate period, must be determined. The main gate period may be entered by the user into the ROM memory of microprocessor 14 or may be passed to microprocessor 14 through keyboard 26. In either case, the main gate period may be a constant or may be an initially short period to quickly display a measured frequency. Thereafter, the main gate period may be lengthened in subsequent measurements to produce a more accurate frequency measurement.

Also preliminarily, the difference frequency "DF" and the number of "successful" measurements "T" must be determined. As mentioned, the value of 10 kHz for "DF" and 2 for "T" have been found to be particularly effective. These, or other values, may also be stored in ROM memory on microprocessor 14 or passed to microprocessor 14 through keyboard 26.

In addition, the value of "K" must be preliminarily determined. The value of "K" will depend on the application of the instant invention, For example, if the signal of interest is a transmission from a so called "body wire", the signal strength at equal distance would likely be less than the signal strength from a commercial radio transmitter which is but one of a variety of possible signals of interest.

Once again, the value of "K" may be preset into ROM memory, particularly where the improved counter 12 is used for a specific purpose, or may be passed to microprocessor 14 through keyboard 26. Passing a value for "K" through keyboard 26 is particularly useful where the improved counter 12 is used for a variety of applications.

In addition to the preliminary matters discussed above, reference to the flow chart shows that before a frequency measurement is made, certain additional preliminary measures are to be performed as indicated by step 34. These preliminary matters are that the main counter 7 is cleared and registers C, F, F-Last and I are set to zero. Main gate 6 is then closed under the direction of microprocessor 14 for a predetermined main gate period so that pulses generated by input circuitry 20 will be passed to main counter 7.

Step 36 asks if main gate 6 is closed. If main gate 6 is closed, step 38 simultaneously stores the number of pulses counted by main counter 7 in register "C". Step 40 asks if main gate 6 is open. If the answer is "no", that is, main gate 6 is closed, register C continues to store the number of pulses counted by main counter 7. If the answer is "yes" the program passes to step 41.

Step 41 calculates the frequency of the signal measured by dividing the contents of register "C", the number of pulses counted, by the time main gate 6 was opened. This frequency is stored in register "F".

Step 42 calculates the difference "D" between the numbers stored in register "F" and "F-LAST". After "D" is calculated, the program proceeds to step 44.

Step 44 asks if the value of "D" is less than or equal to the value of "DF", the difference frequency between subsequent frequency measurements. If the value of "D" is less than or equal to "DF", the frequency difference between subsequent frequency measurements does not differ by an amount exceeding the difference frequency "DF". This indicates that the frequency determined most likely resulted from a frequency measurement of a signal of interest and is not a frequency measurement of an amplifier self-oscillation signal. When such a frequency measurement of a signal of interest has been made, as indicated by a "yes" answer to step 44, step 46 increments register I by one.

Thereafter, step 48 asks whether the value of register I equals the number "T" entered through keyboard 26 or preset into ROM memory in the microprocessor 14. If the answer to the question of step 48 is "yes", the program passes to step 60 where the contents of register "F" may be displayed on display 9. If the answer to the question of step 48 is "no", the program returns to step 36 through steps 50 and 52 as described hereafter, where main gate 6 is opened under the direction of microprocessor 14 and a new frequency determination is performed.

If the answer to step 44 is "no", the program is passed to step 50 where the frequency stored in register "F" is moved to register "F-LAST". Step 52 resets registers "C" and "F" and passes the program to step 36 to begin a new frequency measurement. Register "C" is free to hold the count of the pulses passed through main gate 6 while register "F" is free to contain the new frequency determined. Registers "F-LAST" stores the last frequency measure determined for the purpose of calculating "D" in step 42.

In this way, a dominant signal of interest will have its frequency measured by the improved counter 12, which will also be able to tell that the frequency measured is from a signal of interest and not an amplifier self-oscillation signal. Only the frequency of a signal of interest will get to step 60 where the frequency may be displayed on display 9.

As shown in FIG. 1, a signal level detector 18 is also contained within the improved counter 12. Signal level detector 18 is preferably of a diode detector type, as is well known in the art, which produces an output voltage proportional to the sum of all the signal strengths present at the input within the input frequency spectrum. This sum signal level will vary with the time of day and with geographic location and represents an average background signal level when the measurement taken is not particularly close to a transmitter. Not particularly close means away from the near field of a transmitting transmitter.

An analog to digital converter 22 converts the analog signal from signal detector 18 to a digital signal for use by microprocessor 14.

Microprocessor 14 controls the signal level detection through a program operating according to the flow chart shown in FIG. 2.

As mentioned, as part of the preliminary matters to the operation of the improved counter 12, a constant "K" is sent to microprocessor 14 through keyboard 26 or is stored in the ROM memory of microprocessor 14. "K" represents a level above the reference background signal level that is considered significant and represents a significant change in the signal level that is observed. If "K" is set too low, too many false alarms will occur. On the other hand, if "K" is set too high, the improved counter 12 may not recognize that a strong signal of interest is present. Step 34 enables the signal level measurement to begin.

Thereafter, step 62 initially measures the digitalized output of signal level detector 18, which is proportional to the background signal strength, and stores it in register "R" (step 72). This initial reference signal level is then used to compare with the current signal level to detect a significant increase in the current signal level.

Step 64 continuously compares the reference signal level stored in register "R" with the current signal level passed from signal detector 18 to microprocessor 14 through analog to digital converter 22. The current signal strength is displayed according to step 76 through a display such as an analog meter or digital display.

Step 66 periodically asks if the current signal level exceeds the reference signal level stored in register "R" plus "K", thereby indicating the probable presence of a nearby transmission. If the answer to the question of step 66 is "yes", step 70 activates a signal level warning. This signal level warning may be a visual or audible alarm or combination of these to alert the user to the transmission.

Further, if the answer to the question of step 66 is "yes", step 68 asks whether the display of the measurement of a frequency as performed by steps 36 through 58 as described above should be enabled. If the answer to step 68 is "yes", the frequency, which is most probably the frequency of the nearby transmission, is displayed on display 9 by step 60.

If the current signal level is less than the reference signal plus "K", a "no" answer will be produced at step 66. The current signal strength level continues to be compared to the reference level by step 64 and displayed according to step 76. However, because no strong signal is present, no alarm is given.

In this way, a dominant signal representing a nearby transmission will be detected and an alarm sounded. In addition, in one embodiment, the display of frequencies measured may be disabled until a dominant signal having a signal strength larger than the reference signal level by "K" is detected. Then, the frequency of the dominant signal may be displayed.

Signal level detector 18 is preferably placed after the input circuitry 20. This placement of signal level detector 18 allows the input signal of interest to be amplified before it is passed to the signal level detector 18. Because the amplitude of any amplifier self-oscillation signal present remains nearly constant at a specific amplifier gain, despite its change in frequency with time, the additional signal level from the amplifier self-oscillation signal will be part of the measured background input signal level. The presence of a dominant signal of interest will cause the input signal level to rise above this background input signal level as described above.

The instant invention has been described in connection with a specific preferred embodiment containing both an improved frequency measuring device and an improved signal strength device. However, either of these devices may be used independently of the other in the device or separate devices containing exclusively one or the other device may be constructed according to the teachings of this disclosure. It is to be understood that the embodiments disclosed herein have been given by way of illustration and not for the purposes of limitation. It is recognized that changes and modifications may be made to the description contained herein and still be within the scope of the invention. It is further recognized that obvious changes and modifications will occur to those skilled in the art.

What is claimed is:

1. A method for distinguishing the frequency of a main periodic RF signal carrier input of interest from the frequency of signal noise inherent in the main periodic RF signal carrier which becomes more apparent when said main periodic RF signal carrier is amplified, said method comprising the steps of:

(a) periodically sampling said main periodic input RF signal carrier to receive at least two signal samples;

(b) measuring the frequency of each said at least two signal samples to acquire at least two frequency measurements;

(c) calculating a difference in frequency measurements between said at least two frequency measurements and comparing said difference to a preselected amount;

(d) incrementing a measurement counting register in response to a determination that said difference in frequency measurements between said at least two signal samples differs by less than said preselected amount; and (e) generating control signals when said measurement counting register equals a predetermined value.

2. The method of claim 1 wherein said control signals enable a display to display the frequency of a sample RF input signal, representing the frequency of said main periodic RF signal carrier.

3. A method for determining when a dominant input RF signal is present at a frequency counter so that a useful frequency measurement can be made of a main periodic RF input signal, said method comprising the steps of:

(a) periodically sampling said main periodic input RF signal to receive at least two signal samples;

(b) measuring the signal strength of an entire input RF spectrum of one of said at least two signal samples to produce a reference RF signal strength;

(c) subsequently measuring the signal strength of an entire input RF spectrum of a second of said at least two signal samples to produce a comparison RF signal strength;

(d) calculating a difference between the comparison RF signal strength and the reference RF signal strength; and (e) generating control signals when the difference between the comparison RF signal strength exceeds the reference RF signal strength by a predetermined amount.

4. The method of claim 3 wherein the step of measuring the signal strength of the entire RF spectrum of said reference RF signal strength includes representing the reference RF signal strength by a first voltage with an amplitude proportional to the reference RF signal strength; and, wherein the step of subsequently measuring the signal strength of the entire input RF spectrum of said comparison RF signal strength includes representing the comparison RF signal strength by a second voltage with an amplitude proportional to the comparison input RF signal strength.

5. The method of claim 4 wherein said control signals enable a display to display the frequency of said main periodic RF input signal of interest, said frequency determined by said frequency counter.

6. A method for distinguishing the frequency of a main periodic RF input signal of interest from the frequency of electrical noise inherent in the main periodic RF signal which becomes more apparent as the main periodic RF signal is amplified, said method also for determining when the main periodic RF input signal is present at a frequency counter so that an accurate frequency measurement can be made, said method comprising the steps of:

(a) periodically sampling said main periodic RF input signal to receive at least two signal samples;

(b) measuring the frequency of each said at least two signal samples to acquire at least two frequency measurements;

(c) calculating a difference in frequency measurements between said at least two frequency measurements and comparing said difference to a preselected amount;

(d) incrementing a measurement counting register in response to a determination that said difference in frequency determined between said at least two frequency measurements differs by less than a preselected amount so as to generate a first control signal when said measurement counting register equals a predetermined value;

(e) measuring the signal amplitude of an entire input RF spectrum of one of said at least two signal samples to produce a reference RF signal strength;

(f) subsequently measuring the signal amplitude of an entire input RF spectrum of a second of said at least two signal samples to produce a comparison RF signal strength;

(g) calculating a difference between the signal amplitude of the comparison RF signal strength and the reference RF signal strength;

(h) generating a second control signal when the difference between the signal amplitude of the comparison RF signal strength exceeds the reference RF signal strength by a predetermined amount.

7. The method of claim 6 further comprising the step of displaying the frequency of said main periodic input RF signal of interest in response to the presence of at least one of said first control signal and said second control signal so as to indicate that a valid frequency measurement has been achieved, said first control signal being in response to a determination that said at least two frequency measurements of said at least two signal samples differed by less than a preselected amount for a predetermined number of increments, said second control signal being generated when the signal amplitude of the comparison RF signal strength exceeds the signal amplitude of the reference RF signal strength by a predetermined amount.

8. A frequency counter for determining the frequency of a main periodic RF input signal of interest having signal noise, said frequency counter distinguishing the frequency count of said main periodic RF input from the frequency count of the signal noise inherent in said main periodic RF signal which becomes more apparent when said main periodic RF signal is amplified, said frequency counter comprising:

(a) input means for receiving said main periodic RF input signal;

(b) amplifying means electrically coupled to said input means for amplifying said main periodic RF input signal to improve the efficiency of said frequency counter in detecting zero crossings;

(c) periodic sampling means electrically associated with said amplifying means for capturing a plurality of samples of said main periodic RF input signal;

(d) frequency measuring means electrically associated with said periodic sampling means and said amplifying means for measuring the frequency of each of said plurality of samples of said main periodic RF input signal;

(e) comparing means electrically associated with said frequency measuring means for calculating a difference in frequency measurements between individual samples of said plurality of samples of said main periodic RF input samples and for comparing said difference in said frequency measurements to a preselected amount;

(f) control signal generating means electrically associated with said comparing means for enabling said frequency measurements to be displayed in response to a determination that said difference in said frequency measurements is less than the preselected amount; and (g) frequency display means electrically connected to said control signal generating means for displaying said frequency measurement of said main periodic RF input signal in response to signals generated by said control signal generating means.

9. The frequency counter of claim 8 wherein said periodic sampling means is controlled by a microprocessor.

10. The frequency counter of claim 9 wherein said means for periodically sampling comprises:

(a) signal conditioning means electrically coupled to said amplifying means and said microprocessor for converting said main periodic RF input signal into a series of electronic trigger pulses of constant amplitude, each said trigger pulse representing a cycle of said main periodic RF input signal of interest;

(b) a main gate electrically associated with said microprocessor and said signal conditioning means, said main gate periodically opened and closed for a predetermined amount of time under the direction of said microprocessor, said trigger pulses passing from said signal conditioning means through said main gate; and, (c) counting means electrically connected to said main gate for counting said trigger pulses from said signal conditioning means as said pulses pass through said main gate from said signal conditioning means to said counting means.

11. The frequency counter of claim 10 wherein said frequency measuring means includes:

(a) timing means for controlling and storing the length of time said main gate is closed to allow said trigger pulses to pass from said signal conditioning means to said counting means;

(b) computing means, within said microprocessor for dividing the number of said trigger pulses counted by the length of time said main gate is closed.

12. The frequency counter of claim 11 wherein said comparing means comprises said microprocessor, said microprocessor storing the frequency measurements of said plurality of samples of said main periodic RF input signal and thereafter arithmetically comparing said frequency measurements to the preselected amount.

13. The frequency counter of claim 12 wherein said control signal generating means is electrically coupled within said microprocessor so as to be under the control of said microprocessor.

14. The frequency counter of claim 8 wherein said periodic sampling means comprises:

(a) signal conditioning means electrically associated with said amplifying means for converting said main periodic RF input signal into a series of electronic trigger pulses of constant amplitude each said trigger pulse representing a cycle of said signal;

(b) an electrically controlled main gate connected to said signal conditioning means, said main gate periodically opened and closed for a predetermined amount of time for capturing said plurality of samples; and (c) counting means electrically associated with said main gate for counting the number of said trigger pulses from said signal conditioning means passing through said main gate from said signal conditioning means to said converting means.

15. The frequency counter of claim 14 wherein said frequency measuring means includes:

(a) timing means for controlling and storing the length of time said main gate is closed to allow said trigger pulses to pass from said signal conditioning means to said counting means;

(b) computing means electrically coupled to said counting means for dividing the number of said trigger pulses counted by the length of time said main gate is closed.

16. The frequency counter of claim 8 wherein said comparing means includes a microprocessor for storing the frequency measurements of said plurality of samples of said main periodic RF input signals and for thereafter arithmetically comparing said frequency measurements.

17. The frequency counter of claim 8 wherein said comparing means includes a storing means for storing the frequency measurements of said plurality of samples of said main period RF input signals and for thereafter comparing the frequency measurements.

18. The frequency counter of claim 8 wherein said control signal generating means is electrically coupled within a microprocessor so as to be under the control of said microprocessor, said microprocessor determining when the difference of frequency measurements is below a predetermined value so as to enable said control signal generating means to enable said frequency display means.

19. The frequency counter of claim 8 further comprising:

(h) amplitude measuring means for making multiple measurements of the signal strength of an entire input RF spectrum of said main period RF input signal sample to produce a reference input RF signal strength and for subsequently measuring the signal strength of a subsequent input RF spectrum sample of said main period RF input signal to produce a measured input RF spectrum;

(i) signal strength differential means for comparing the signal strength of the measured input RF spectrum with the reference input RF signal strength; and (j) said control signal generating means for generating control signals when the signal strength of the subsequently measured input RF spectrum exceeds the signal strength of the reference input RF signal strength so as to indicate a dominant signal transmission.

20. The frequency counter of claim 19 wherein said control signal generating means transmits control signals to enable said frequency display means to display the frequency measurement of said main period RF input signal.

21. The frequency counter of claim 19 wherein said amplitude measuring means comprises a diode detector signal level detector.

22. The frequency counter of claim 19 wherein said signal strength differential means comprises a microprocessor, said microprocessor storing the reference input RF signal strength and the subsequently measured input RF spectrum signal strength and arithmetically comparing the respective signal strengths.

23. The frequency counter of claim 22 wherein said control signal generating means is electrically disposed within said microprocessor so as to be under the control of said microprocessor, said microprocessor enabling said frequency display means to display the frequency measurement of said main period RF signal when the signal strength of the subsequently measured input RF spectrum exceeds the signal strength of the reference input RF signal strength.

24. A frequency counter for determining when a dominant input RF frequency of interest is present and for determining the frequency of said input RF signal of interest comprising:

(a) amplitude measuring means for initially measuring the signal strength of an entire input RF spectrum sample of said input RF signal to produce a reference input RF signal strength and for subsequently measuring the signal strength of a subsequent input RF spectrum sample of said input RF signal to produce a measured input RF spectrum;

(b) comparing means for comparing the signal strength of the measured input RF spectrum with the reference input RF signal strength;

(c) control signal generating means for generating control signals when the signal strength of the subsequently measured input RF spectrum exceeds the signal strength of the reference input RF signal strength; and, (d) frequency measuring means for determining the frequency of the dominant input RF signal of interest.

25. The frequency counter of claim 24 further comprising frequency display means electrically associated with said control signal generating means for displaying the frequency of said dominant signal of interest under the command of signals from said control signal generating means.

26. The frequency counter of claim 24 wherein said amplitude measuring means comprises a diode detector signal level detector.

27. The frequency counter of claim 24 wherein said comparing means comprises a microprocessor, said microprocessor storing the reference input RF signal strength and the subsequently measured input RF signal strength and arithmetically comparing the respective signal strengths.

28. The frequency counter of claim 27 wherein said control signal generating means is electrically disposed within said microprocessor so as to be under the control of said microprocessor, said microprocessor enabling said frequency display means so as to display the frequency measurement of said main period RF signal when the signal strength of the subsequently measured input RF spectrum exceeds the signal strength of the reference input RF signal strength.

29. A frequency counter for determining the frequency of a main periodic RF input signal having signal noise, said frequency counter distinguishing the frequency count of said main periodic RF input from the frequency count of the signal noise inherent in said main periodic RF signal which becomes more apparent when said main period RF signal is amplified, said frequency counter comprising:

(a) signal conditioning means for receiving said main period RF input signal and generating a series of amplified electronic trigger pulses at a frequency equal to that of said RF input signal and at a constant amplitude;

(b) an electrically controlled main gate electrically coupled to said signal conditioning means for allowing said RF input signal to pass from said signal conditioning means through said main gate, said main gate periodically enabled so as to individually capture at least two samples of said RF input signal, said at least two samples of said RF input signal having a fixed period length;

(c) frequency measuring means for providing individual frequency measurements of said at least two samples captured, said main gate allowing said at least two samples of said RF input signal to pass to said frequency measuring means;

(d) a microprocessor including a main gate enabling means and a frequency differentiating means, said main gate enabling means electrically coupled to said main gate for controlling the triggering of said main gate at a predetermined rate so as to capture individually said at least two samples having a fixed period length, said frequency differentiating means electrically coupled to said frequency measuring means for temporarily storing said frequency measurements of said at least two samples and computing a difference between said frequency measurements so as to differentiate between a frequency measurement of said RF input signal and said signal noise, said microprocessor including a frequency display enabling means for enabling a frequency display to display a correct reading of said RF signal input.

* * * * *